(12) United States Patent
Ishida

(10) Patent No.: US 6,219,271 B1
(45) Date of Patent: Apr. 17, 2001

(54) SEMICONDUCTOR MEMORY DEVICE

(75) Inventor: Minoru Ishida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/490,080

(22) Filed: Jan. 24, 2000

(30) Foreign Application Priority Data

Jan. 27, 1999 (JP) ................................................ 11-018981

(51) Int. Cl.$^7$ ................................................... G11C 11/00
(52) U.S. Cl. ......................................... 365/154; 365/156
(58) Field of Search ..................................... 365/154, 156

(56) References Cited

U.S. PATENT DOCUMENTS

| | | | | |
|---|---|---|---|---|
| 5,222,039 | * | 6/1993 | Vinal ..................................... | 365/156 |
| 5,379,251 | * | 1/1995 | Takeda et al. ........................ | 365/154 |
| 5,384,731 | * | 1/1995 | Kuriyama et al. ................... | 365/154 |
| 5,732,015 | * | 3/1998 | Kazerounian et al. .............. | 365/154 |
| 5,793,670 | * | 8/1998 | Wada et al. ........................... | 365/154 |
| 5,808,942 | * | 9/1998 | Sharpe-Geisler ..................... | 365/156 |

* cited by examiner

*Primary Examiner*—Trong Phan
(74) *Attorney, Agent, or Firm*—Ronald P. Kananen; Rader, Fishman & Grauer

(57) ABSTRACT

A semiconductor memory device enabling a reduction in size of a memory cell and higher integration. A drive transistor and a word transistor are formed in a p-type active region. Similarly, another drive transistor and another word transistor are formed in another p-type active region. A word line is wired so as to be substantially orthogonal to both of the p-type active regions. A pMOS load transistor is formed in an n-type active region, and another load transistor is formed in another n-type active region. A channel width of the drive transistor is greater than a channel width of the load transistor. Thereby, a cell area can be reduced while achieving the cell current and the SNM equivalent to those of a conventional SRAM cell.

7 Claims, 5 Drawing Sheets

SEMICONDUCTOR MEMORY DEVICE

BACKGROUND OF THE INVENTION

1. Field of the Invention

The present invention relates to a semiconductor memory device in which a memory cell has a CMOS (Complementary Metal Oxide Semiconductor) configuration, such as a SRAM (Static Random Access Memory) cell with a six-transistor configuration.

2. Description of the Related Art

A SRAM cell generally has a latch and two transistors (word transistors). On-off operations of the transistors are controlled based on the voltage applied to a word line and thereby connection between each of two memory nodes of the latch and a bit line is made or broken. SRAM cells can be broadly divided into two types, namely, a MOS transistor load type and a high resistance load type; where the difference is based on a load element of the latch. SRAM cells of the MOS transistor load type, configured with six transistors, can be further broken down into two known types: a P-channel MOS transistor (called pMOS in the followings) load type and a TFT (Thin Film Transistor) load type, depending on the type of its load transistor.

FIG. 5 shows an example of a configuration pattern of a SRAM cell of the pMOS load type according to the related art. In FIG. 5, a SRAM cell is shown provided with a gate of the transistor. Wire connection inside the cell or upper wiring layers such as bit lines are omitted. Instead, FIG. 5 discloses the connection between portions effected by the upper wiring layers together with the pattern diagram.

The SRAM cell 100 of the pMOS load type has two p-type active regions 101a and 101b, and two n-type MOS active regions 102a and 102b. In the p-type active regions 101a and 101b, an n-channel MOS transistor (called nMOS in the followings) as a drive transistor is formed. In the n-type active regions 102a and 102b, a p-channel MOS transistor (called pMOS in the followings) as a load transistor is formed. The p-type active regions 101a and 101b, and the n-type active regions 102a and 102b are surrounded by an element separation insulating region of LOCOS (Local Oxidation of Silicon) or trench construction, for example.

In the SRAM cell 100 of the related art, the two p-type active regions 101a and 101b are turned outward approximately at a right angle in plan configuration. In the p-type active region 101a, a drive transistor Qn1 and a word transistor Qn3 are formed on both turned ends, sandwiching the bend. In the p-type active region 101b, a drive transistor Qn2 and a word transistor Qn4 are formed on both turned ends, sandwiching the bend. A word line (WL) 104, which also works as gate electrodes of the word transistors Qn3 and Qn4, is substantially orthogonal to both of the p-type active regions 101a and 101b. The word line 104 is provided through cells in the horizontal direction as shown in FIG. 5. On the other hand, common gate lines 103a and 103b, which work as gate electrodes of the drive transistors Qn1 and Qn2, are provided to each cell separately. The common gate line 103a is provided in the vertical direction as shown in FIG. 5 and orthogonal to the p-type active region 101a. The common gate line 103b is provided in the same direction and orthogonal to the p-type active region 101b.

The common gate lines 103a and 103b are also orthogonal to the n-type active region 102a and 102b, respectively. Thereby, pMOS transistors (load transistors Qp1 and Qp2) are formed in the n-type active regions 102a and 102b, respectively. The load transistor Qp1 and the drive transistor Qn1 constitute a first inverter. The load transistor Qp2 and the drive transistor Qn2 constitute a second inverter. The first inverter and the second inverter constitute a latch. Each of the common gate lines 103a and 103b branches off at some mid point. As shown in the connection in FIG. 5, an input terminal of one inverter is connected to an output terminal of another inverter by a second wiring layer. Further, a Vcc (source voltage) supply line 105a, a Vss (common potential) supply line 105b, a bit line (BL1) 106a and a bit line (BL2) 106b are connected as shown.

Generally, in the SRAM cell with the above-described six-transistor configuration of the related art, DTw/WTw=1.0 and LTw/WTw=1.0, where DTw denotes a channel width of the drive transistors Qn1 and Qn2, WTw denotes a channel width of the word transistors Qn3 and Qn4, and LTw denotes a channel width of the load transistors Qp1 and Qp2. In other words, the channel width of the drive transistors Qn1 and Qn2 and the channel width of the load transistors Qp1 and Qp2 are made to be equal to the channel width of the word transistors Qn3 and Qn4.

However, in the case of a SRAM aimed for high-speed operations, a large cell current is required in order to minimize a delay in a bit line. As a result, an increase in the channel width WTw of the word transistors is needed. Thus, designing the SRAM cell while maintaining the above-described relationship, DTw/WTw=1.0 and LTw/WTw=1.0, causes an increase in, especially, the channel width LTw of the load transistors Qp1 and Qp2, which are the only load transistors within the cell. This results in an increase in a cell size in a direction of the bit line, causing a problem in high integration.

The present invention is made in view of such a problem. An object of the invention is to provide a semiconductor memory device making it possible to reduce the size of memory cells and to achieve higher integration.

A semiconductor memory device according to the present invention comprises a plurality of memory cells, where each memory cell is provided with a pair of drive transistors of a first conductive type, a pair of load transistors of a second conductive type and a pair of word transistors of the first conductive type, wherein the relationship between a channel width DTw of the drive transistors and a channel width LTw of the load transistors is given by DTw/LTw>1.0, more preferably, DTw/LTw>1.4.

Particularly, the semiconductor memory device according to the present invention is suitable for a SRAM comprising a first active region in which a channel of the drive transistor and a channel of the word transistor are formed, a second active region in which a channel of the load transistor is formed, a word line which works as å gate electrode of the word transistor, and a common gate line which connects between a gate of the drive transistor and a gate of the load transistor, wherein a channel current direction of the drive transistor and a channel current direction of the word transistor are orthogonal to each other in the first active region, the word line is orthogonal to the first active region, and the common gate line is orthogonal both to the first active region and to the second active region.

In the semiconductor memory device according to the present invention, the channel width DTw of the drive transistor is made greater than the channel width LTw of the load transistor. Accordingly, the cell size can be reduced, as compared to the case with a semiconductor memory device of the related art with the relationship of DTw/LTw=1.

Other and Further objects, features and advantages of the invention will appear more fully from the following description.

DETAILED DESCRIPTION OF THE PREFERRED EMBODIMENTS

Embodiments of the present invention will be described below in detail with reference to the accompanying drawings.

First Embodiment

Figure 2:
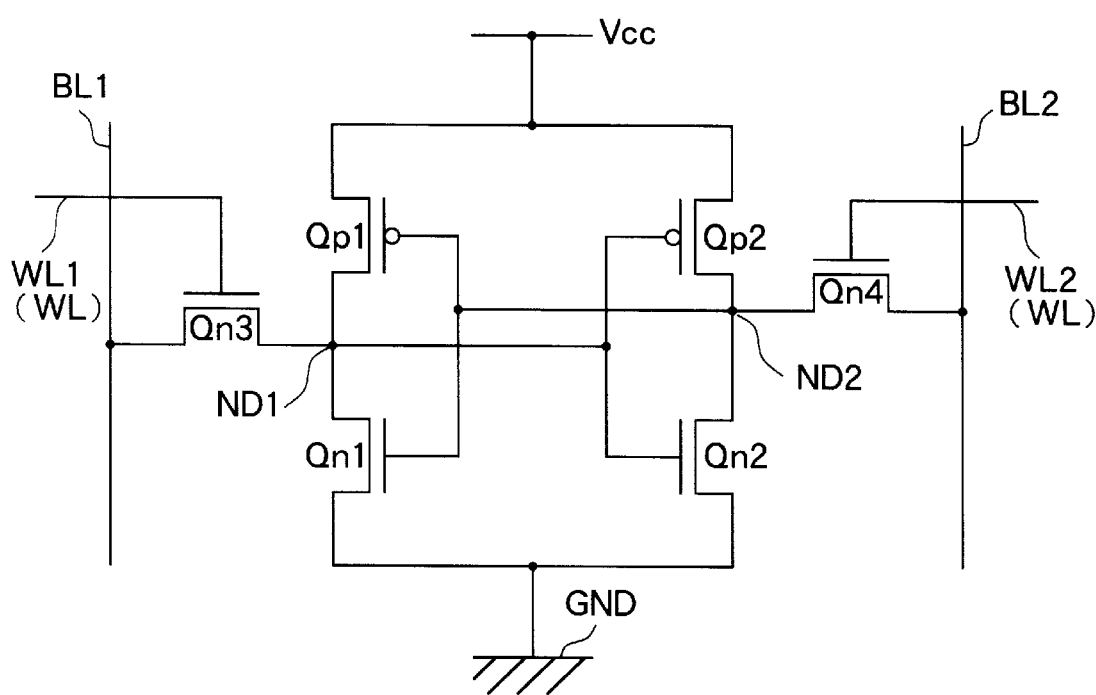
FIG. 2 is a block diagram of a circuit of the SRAM cell shown in FIG. 1.

First, a circuit configuration of a SRAM cell of the pMOS load type according to a first embodiment of the invention will be described with reference to FIG. 2.

The SRAM cell of the pMOS load type, having a six-transistor configuration, includes n-channel MOS transistors (called nMOS in the followings) Qn1 and Qn2, p-channel MOS transistors (called pMOS in the followings) Qp1 and Qp2. The nMOS Qn1 and Qn2 work as drive transistors, while the pMOS Qp1 and Qp2 work as load transistors. The pMOS Qp1 and Qp2 load transistors, and the nMOS Qn1 and Qn2 drive transistors form two inverters (latch). The input terminals of the inverters are crossed over each other; an input terminal of one inverter is connected to an output terminal of another inverter, while an input terminal of the latter inverter is connected to an output terminal of the former inverter.

The nMOS transistors Qn3 and Qn4 are word transistors for controlling the connection of connecting points (memory nodes ND1 and ND2) of each inverter to bit lines BL1 and BL2 based on the voltage applied to word lines WL1 and WL2. This cell configuration is common, and more detailed description of the connection is omitted.

In the SRAM cell of the pMOS load type, one bit line BL1 is maintained at a high potential while a predetermined voltage is applied to the gate of the word transistors Qn3 and Qn4 through word lines WL1 and WL2. Thereby, both transistors Qn3 and Qn4 are turned to ON to accumulate charge in the memory nodes ND1 and ND2. The drive transistors Qn1 and Qn2, and the load transistors Qp1 and Qp2 operate such that, when one memory node is "H (high)," another memory node is "L (low)," as is characteristic of a latch configuration. For example, when the memory node ND1 is "H" and the memory node ND2 is "L," the drive transistor Qn2 and the load transistor Qp1 are turned to ON and the drive transistor Qn1 and the load transistor Qp2 are turned to OFF. As a result, the memory node ND1 receives charge from a supply line of a source voltage Vcc, and the memory node ND2 is continuously kept at the grounded potential. Conversely, if the memory node ND1 is forced to "L" by turning the word transistor Qn3 to ON when the bit line BL1 potential is "L," or if the memory node ND2 is forced to "H" by turning the word transistor Qn4 to ON when the bit line BL2 potential is "H," the drive transistors Qn1 and Qn2, and the load transistors Qp1 and Qp2 are all inverted, and the memory node ND2 receives charge from the supply line of the source voltage Vcc to keep the memory node ND1 at the grounded potential. In this way, maintaining charge by the latch keeps charge in the memory nodes ND1 and ND2 statically. The potential of "L" or "H" is made to correspond to data of "0" or "1," respectively, so that the data can be stored in six transistors within the cell.

Figure 1:
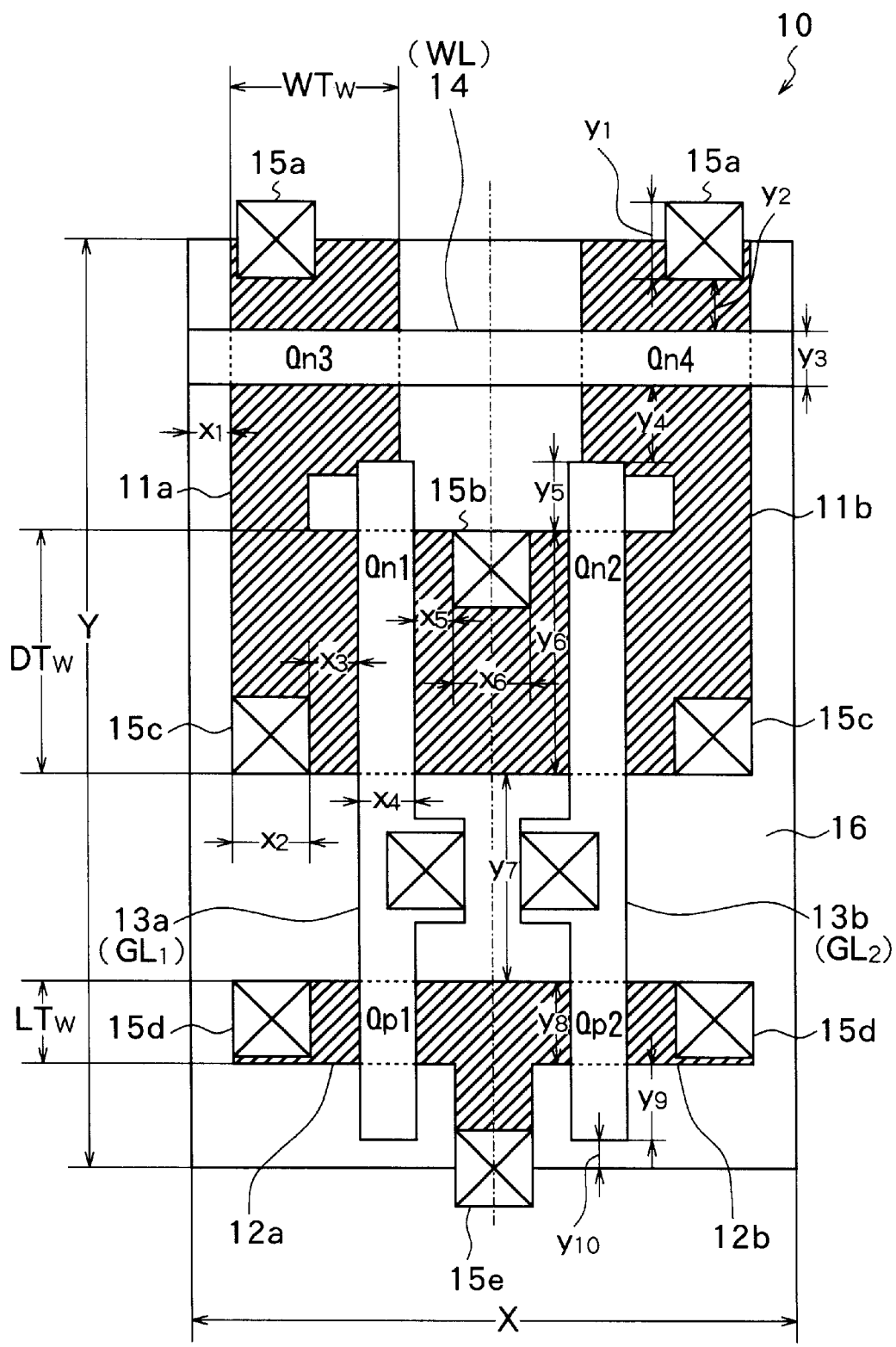
FIG. 1 is a pattern layout diagram of a SRAM cell of the pMOS load type according to a first embodiment of the invention.

Next, the pattern layout of a SRAM cell of a six-transistor type according to the first embodiment of the invention will be described with reference to FIG. 1. The SRAM cell 10 includes p-type active regions 11a and 11b as a first conductive type region, and n-type active regions 12a and 12b as a second conductive type region. The p-type active regions 11a and 11b, and the n-type active regions 12a and 12b are surrounded by an element separation insulating region 16 of LOCOS or of trench construction, for example.

In the SRAM cell 10, the p-type active regions 11a and 11b are turned inward in the form of an "L" in plan configuration. In this embodiment, the p-type active regions 11a and 11b are connected to each other. In the p-type active region 11a, a drive transistor Qn1 and a word transistor Qn3 are formed on both turned ends, sandwiching the bend. In the p-type active region 11b, a drive transistor Qn2 and a word transistor Qn4 are formed on both turned ends, sandwiching the bend.

A word line (WL) 14, which works as a gate electrode of the word transistors Qn3 and Qn4, is substantially orthogonal to both of the p-type active regions 11a and 11b. The word line 14 is provided through cells in the horizontal direction as shown in FIG. 1. On the other hand, a common gate lines 13a and 13b (GL1 and GL2), which work as gate electrodes of the drive transistors Qn1 and Qn2, are provided to each cell separately. The common gate line 13a is provided in the vertical direction as shown in FIG. 1 and orthogonal to the p-type active region 11a. The common gate line 13b is provided in the same direction and orthogonal to the p-type active region 11b.

The common gate lines 13a and 13b are also orthogonal to the n-type active regions 12a and 12b, respectively. Thereby, a pMOS (load transistor Qp1) is formed in the n-type active region 12a while a pMOS (load transistor Qp2) is formed in the n-type active region 12b. The load transistor Qp1 and the drive transistor Qn1 constitute one inverter. The load transistor Qp2 and the drive transistor Qn2 constitute another inverter. Each of the p-type active regions 11a and 11b is electrically connected to a bit line (not shown) through first contacts 15a and 15a, respectively. Each of the p-type active regions 11a and 11b is also electrically connected to a supply line (not shown) of Vss (common potential) through a second contact 15b. The p-type active region 11a and the n-type active region 12a are electrically connected to each other through a third contact 15c and a fourth contact 15d. The p-type active region 11b and the n-type active region 12b are also electrically connected to each other through a third contact 15c and a fourth contact 15d. The n-type active regions 12a and 12b are commonly connected to a Vcc (source voltage) supply line (not shown) through a fifth contact 15e.

Figure 5:
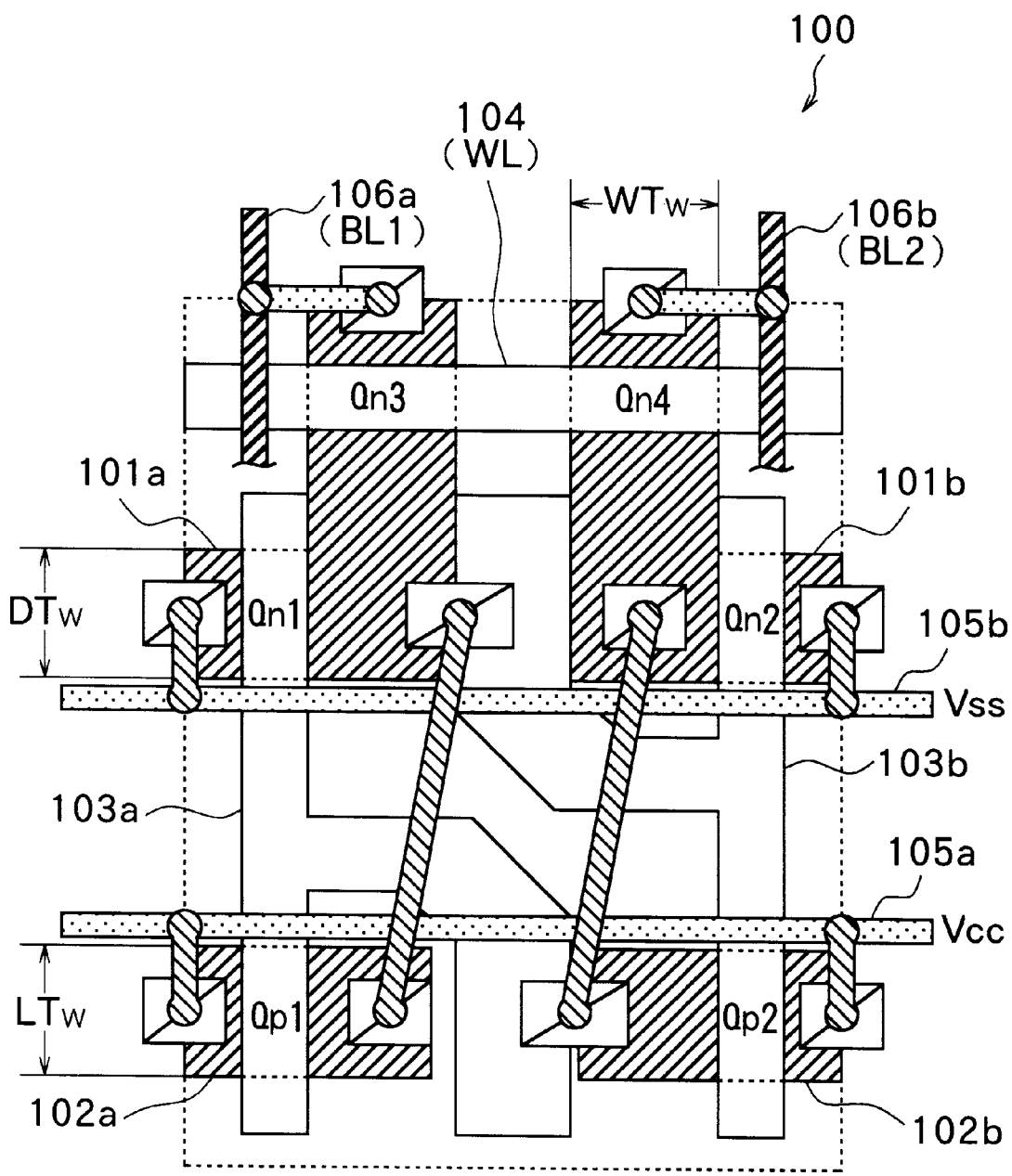
FIG. 5 is a pattern layout diagram of a SRAM cell according to the related art.

The basic configuration of the SRAM cell 10 as described above is substantially the same as that of the SRAM cell 100 (FIG. 5) of the related art, except for the following relationships:

$$DTw/LTw > 1.0 \tag{1}$$

$$WTw/LTw > 1.0 \tag{2}$$

wherein DTw denotes a channel width of the drive transistors Qn1 and Qn2, LTw denotes a channel width of the load transistors Qp1 and Qp2, and WTw denotes a channel width of the word transistors Qn3 and Qn4.

According to the embodiment, the channel width WTw of the word transistors Qn3 and Qn4 is, as described above, specified relatively larger than the channel width LTw of the load transistors Qp1 and Qp2 to minimize a delay in a bit line and to achieve speed-up. Further, the channel width DTw of the drive transistors Qn1 and Qn2 is specified relatively larger than the channel width LTw of the load transistors Qp1 and Qp2. The reason why DTw is made greater than LTw will be described below.

Generally, when designing a SRAM cell with a six-transistor configuration, a cell current (I cell) and a static noise margin (called SNM in the followings) are items to be focused on as cell characteristics. A cell size of the SRAM is determined by the two items, the cell current and SNM.

Below is a list of combination examples, A–C, of the channel width (DTw, WTw, LTw) of each of the drive transistor, the word transistor and the load transistor, for obtaining a necessary and sufficient SNM (that is, SNM of 0.18 or more at a source voltage of 2.5V) at a certain cell current (I cell of 200 $\mu$A, for example). In other words, combinations of the channel width of the transistors for giving a solution of I cell=200 $\mu$A and SNM>0.18V are, for example, as follows:

A. DTw=0.83 $\mu$m, WTw=0.83 $\mu$m, LTw=0.83 $\mu$m

B. DTw=0.96 $\mu$m, WTw=0.74 $\mu$m, LTw=0.48 $\mu$m

C. DTw=1.05 $\mu$m, WTw=0.70 $\mu$m, LTw=0.35 $\mu$m

Next, the relationship between the channel width (DTw, WTw, LTw) of the transistors and an SRAM cell area is as follows. In the SRAM cell shown in FIG. 1, denote a horizontal width of the element separation insulating region 16 between a horizontal edge portion of the cell and the p-type active region 11a by $x_1$. Denote a horizontal width of the third contact 15c by $x_2$. Denote a distance between the third contact 15c and the common gate line 13a by $x_3$. Denote a horizontal width of the common gate line 13a by $x_4$. Denote a distance between the second contact 15b and the common gate line 13a by $x_5$. Further, denote a horizontal width of the second contact 15b by $x_6$. Then, a width X of the SRAM cell 10 in the word line direction (the horizontal direction viewing the drawing) is given by the following equation:

$$X=(x_1\times\frac{1}{2}+x_2+x_3+x_4+x_5+x_6\times\frac{1}{2})\times 2 \tag{3}$$

To illustrate, assume that $x_1$=0.20 $\mu$m, $x_2$=0.20 $\mu$m, $x_3$=0.11 $\mu$m, $x_4$=0.18 $\mu$m, $x_5$=0.11 $\mu$m, $x_6$=0.20 $\mu$m, and that a transistor has the channel width as specified in A–C listed above. Then, X equals to 1.60 $\mu$m in each case.

On the other hand, denote a vertical width of the first contact 15a by $y_1$. Denote a distance between the first contact 15a and a word line (WL) 14 by $y_2$. Denote a width of the word line 14 by $y_3$. Denote a distance between the word line 14 and the common gate line 13a (or 13b) by $y_4$. Denote a length of a region protruded from the p-type active region 11a (11b) of the common gate line 13a (or 13b) by $y_5$. Denote a vertical width of the drive transistor Qn1 (or Qn2) by $y_6$ (equals to DTw). Denote a distance between the drive transistor Qn1 (or Qn2) and the load transistor Qp1 (or Qp2), or a separation width between nMOS and pMOS, by $y_7$. Denote a vertical width of the load transistor Qp1 (or Qp2) by $y_8$ (equals to LTw). Denote a length of a region protruded from the n-type active region 12a (12b) of the common gate line 13a (or 13b) by $y_9$. Further, denote a vertical width of the element separation insulting region 16 between a bottom edge portion of the cell and the common gate line 13a (or 13b) by $y_{10}$. Then, a cell length Y of the SRAM cell 10 in the bit line direction (in the vertical direction viewing the drawing) is given by a following equation:

$$Y=y_1\times\frac{1}{2}+y_2+y_3+y_4+y_5+y_6+y_7+y_8+y_9+y_{10}\times\frac{1}{2} \tag{4}$$

To illustrate, assume that: $y_1$=0.20 $\mu$m, $y_2$=0.11 $\mu$m, $y_3$=0.18 $\mu$m, $y_4$=0.20 $\mu$m, $y_5$=0.20 $\mu$m, $y_6$=DTw, $y_7$=0.50 $\mu$m, $y_8$=LTw, $y_9$=0.20 $\mu$m, $y_{10}$=0.20 $\mu$m. Substituting these values into the equation (4), the following equation (5) is obtained:

$$Y=0.20\times\frac{1}{2}+0.11+0.18+0.20+0.20+DTw+0.50+LTw+0.20+0.20\times\\ \frac{1}{2}(\mu m)=DTw+LTw+1.59(\mu m) \tag{5}$$

Consequently, a value of Y varies depending on values of DTw and LTw.

Figure 3:
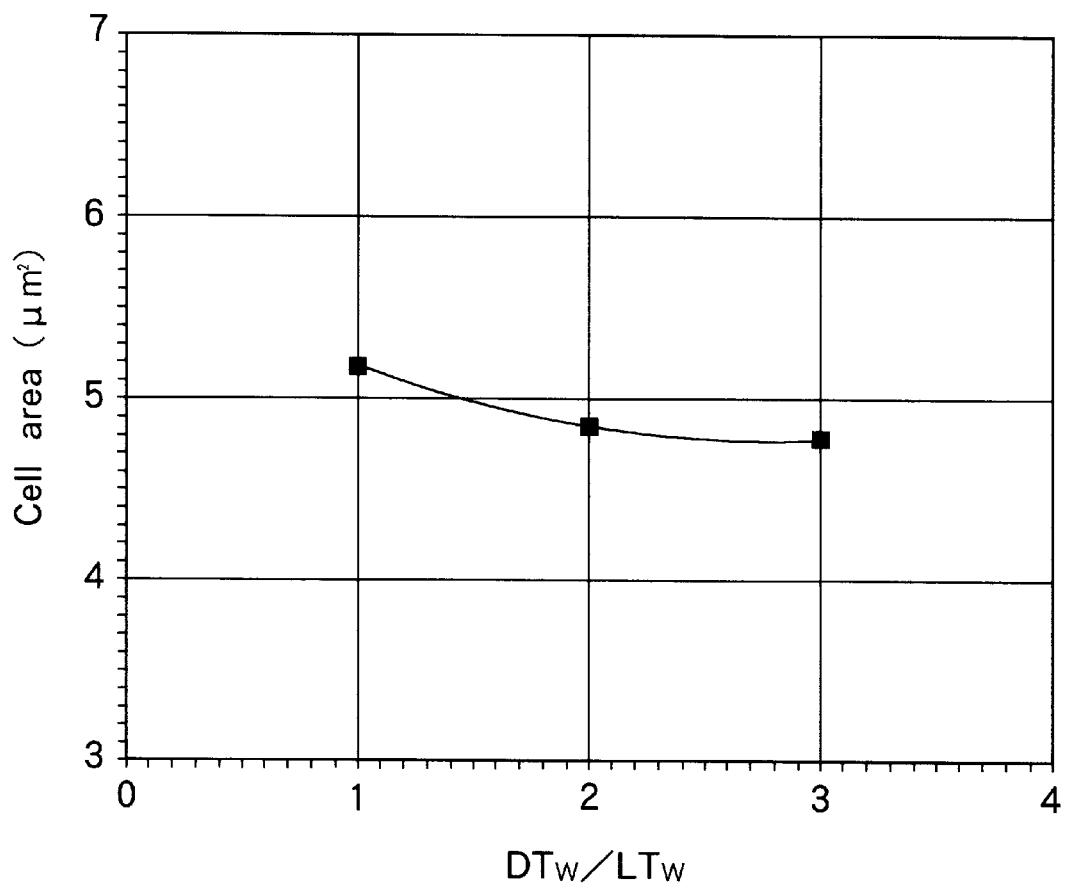
FIG. 3 is a diagram for describing a relationship between DTw/LTw and a cell area of the SRAM cell shown in FIG. 1

Accordingly, when using transistors of sizes as specified in A listed above, the cell width Y in the bit line direction is 3.24 $\mu$m. When using transistors of sizes as specified in B above, the cell width Y equals to 3.03 $\mu$m. When using transistors of sizes as specified in C above, the cell width Y equals to 2.99 $\mu$m. Therefore, the cell area (X·Y) is 5.18 $\mu$m$^2$ when using transistors of sizes as specified in A. The cell area (X·Y) is 4.85 $\mu$m$^2$ when using transistors of sizes as specified in B. The cell area (X·Y) is 4.78 $\mu$m$^2$ when using the transistors of sizes as specified in C. FIG. 3 shows the relationship between a ratio DTw/LTw of the channel width of the drive transistor to the channel width of the load transistor and the cell area in the cases with transistors of sizes as specified in either of A to C above.

As seen from FIG. 3, in the embodiment (cells of B and C above), the cell area can be reduced while achieving the cell current and the SNM equivalent to those of the SRAM cell of the related art by making the channel width DTw of the drive transistor greater than the channel width LTw of the load transistor. Further, the area can be relatively larger by increasing the channel width WTw of the word transistor. As a result, a delay in a bit line can be suppressed, and large cell current can be obtained.

Preferably, the ratio DTw/LTw of the channel width DTw of the drive transistor to the channel width LTw of the load transistor is preferably more than 1.4, more preferably more than 1.5, even more preferably more than 1.7 or more than 2.0. The rate of reduction in the cell area becomes bigger in this order named.

Second Embodiment

Figure 4:
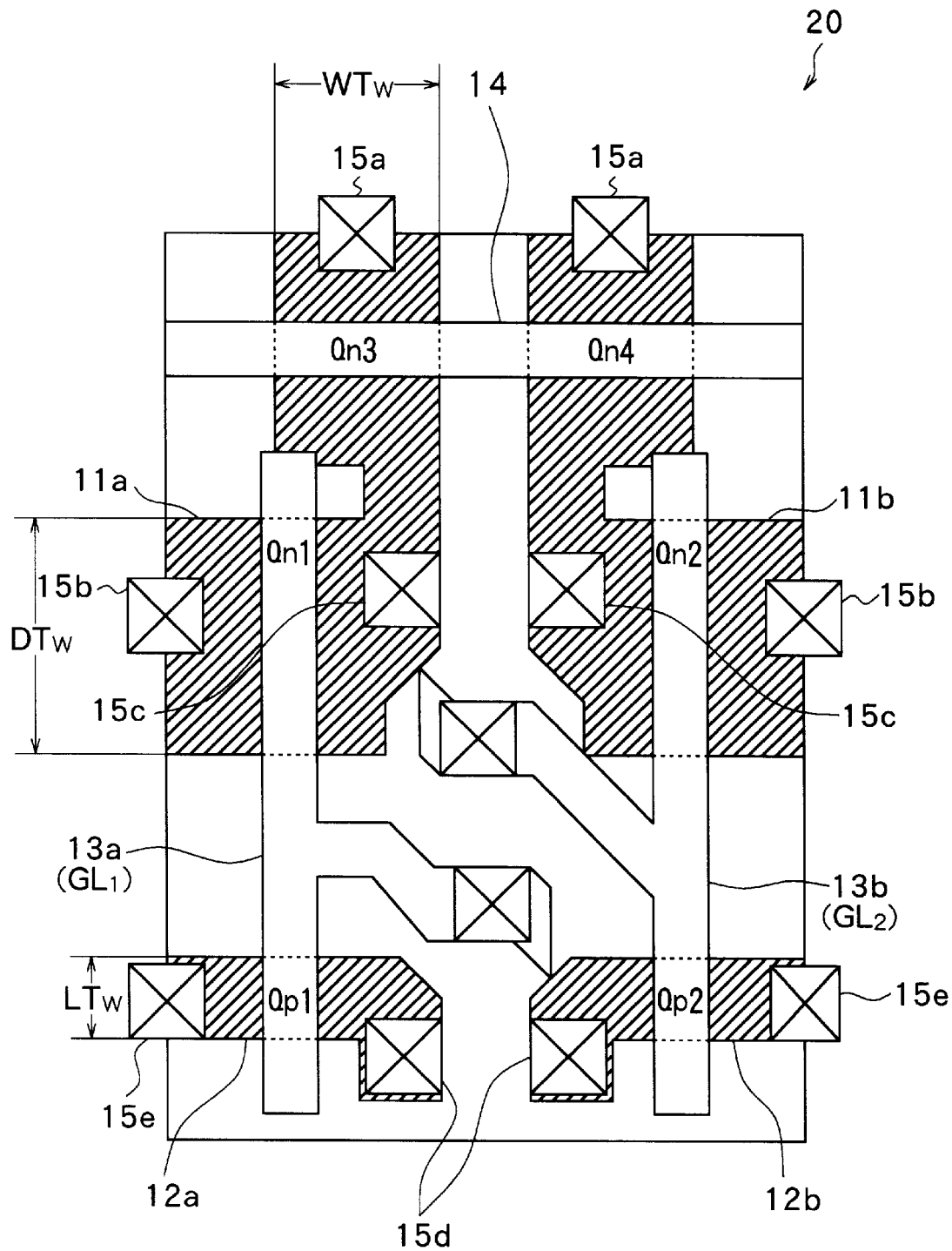
FIG. 4 is a pattern layout diagram of an SRAM cell according to a second embodiment of the present invention.

The present invention can be applied to an SRAM cell 20 with a pattern layout as shown in FIG. 4. Since the basic pattern layout of the SRAM cell 20 is substantially the same as that of the SRAM cell 100 shown in FIG. 5, the same numerals are given to parts with the same functions as those of the first embodiment, and the specific description therefor is omitted. The SRAM cell 20 according to the embodiment has the relationship described in the equation (1) between the channel width DTw of drive transistors Qn1 and Qn2, and the channel width LTw of load transistors Qp1 and Qp2. The SRAM cell 20 also has the relationship described in the equation (2) between the channel width WTw of word transistors Qn3 and Qn4, and the channel width LTw of the load transistors Qp1 and Qp2. Similar to the SRAM cell 10 according to the first embodiment, the cell area can be reduced. In addition, a delay in a bit line can be suppressed to obtain a large cell current.

The present invention is not limited to the first and second embodiments described above but can be applied to an SRAM cell comprising an active region (a first active region) in which a channel of a drive transistor and a channel of a word transistor are formed, and another active region (a second active region) in which a channel of a load transistor is formed, a word line which works as a gate electrode of the word transistor, and a common gate line which connects between a gate of the drive transistor and a gate of the load transistor, wherein the word line is orthogonal to the first active region, and the common gate line is orthogonal both to the first active region and to the second active region.

As described above, according to the semiconductor memory device of the present invention, a cell size can be reduced and higher integration becomes possible since a channel width DTw of a drive transistor is made greater than a channel with LTw of a load transistor.

Further, especially, according to the semiconductor memory device of one aspect of the present invention, a delay in a bit line can be suppressed to obtain a large cell current since a channel width WTw of a word transistor is made greater than a channel width LTw of a load transistor.

Obviously many modification and variations of the present invention are possible in the light of the above teachings. It is therefore to be understood that within the scope of the appended claims the invention may bed practice otherwise than as specifically described.

What is claimed is:

1. A semiconductor memory device comprising a plurality of memory cells, each memory cell being provided with a pair of drive transistors of a first conductive type, a pair of load transistors of a second conductive type and a pair of word transistors of the first conductive type, wherein a relationship between a channel width DTw of the drive transistors and a channel width LTw of the load transistors is given by DTw/LTw>1.0.

2. A semiconductor memory device according to claim 1, wherein the relationship is given by DTw/LTw>1.4.

3. A semiconductor memory device according to claim 1, wherein the relationship is given by DTw/LTw>1.5.

4. A semiconductor memory device according to claim 1, wherein the relationship is given by DTw/LTw>1.7.

5. A semiconductor memory device according to claim 1, wherein the relationship is given by DTw/LTw>2.0.

6. A semiconductor memory device according to claim 1, wherein a relationship betweem a channel width WTw of the word transistor and a channel width LTw of the load transistor is further given by WTw/LTw>1.0.

7. A semiconductor memory device according to claim 1, comprising a first active region in which a channel of the drive transistor and a channel of the word transistor are formed, a second active region in which a channel of the load transistor is formed, a word line which works as a gate electrode of the word transistor, and a common gate line which connects between a gate of the drive transistor and a gate of the load transistor, wherein a channel current direction of the drive transistor and a channel current direction of the word transistor are orthogonal to each other in the first active region, the word line is orthogonal to the first active region, and the common gate line is orthogonal both to the first active region and to the second active region.

* * * * *